United States Patent
Laich et al.

(10) Patent No.: US 9,866,211 B2
(45) Date of Patent: Jan. 9, 2018

(54) PROTECTION DEVICE FOR A SEMICONDUCTOR SWITCH, AND METHOD FOR OPERATING A PROTECTION DEVICE FOR A SEMICONDUCTOR SWITCH

(71) Applicant: Robert Bosch GmbH, Stuttgart (DE)

(72) Inventors: Sebastian Laich, Stuttgart (DE); Peter Sinn, Untergruppenbach (DE)

(73) Assignee: Robert Bosch GmbH, Stuttgart (DE)

( * ) Notice: Subject to any disclaimer, the term of this patent is extended or adjusted under 35 U.S.C. 154(b) by 44 days.

(21) Appl. No.: 14/767,376

(22) PCT Filed: Dec. 27, 2013

(86) PCT No.: PCT/EP2013/078053
§ 371 (c)(1),
(2) Date: Aug. 12, 2015

(87) PCT Pub. No.: WO2014/127872
PCT Pub. Date: Aug. 28, 2014

(65) Prior Publication Data
US 2016/0006426 A1    Jan. 7, 2016

(30) Foreign Application Priority Data
Feb. 19, 2013  (DE) .................. 10 2013 202 641

(51) Int. Cl.
*H02H 3/08* (2006.01)
*H03K 17/082* (2006.01)

(52) U.S. Cl.
CPC ................. *H03K 17/0828* (2013.01)

(58) Field of Classification Search
CPC .................................................. H03K 17/0828
(Continued)

(56) References Cited

U.S. PATENT DOCUMENTS 5,963,407 A * 10/1999 Fragapane ......... H03K 17/0828
361/115
6,087,877 A    7/2000 Gonda et al.
(Continued)

FOREIGN PATENT DOCUMENTS

CN    103457253    12/2013
DE    102010008815    8/2011
(Continued)

OTHER PUBLICATIONS

International Search Report for Application No. PCT/EP2013/078053 dated Apr. 4, 2014 (English Translation, 3 pages).

*Primary Examiner* — Thienvu Tran
*Assistant Examiner* — Lucy Thomas
(74) *Attorney, Agent, or Firm* — Michael Best & Friedrich LLP

(57) ABSTRACT

The invention relates to a surge protection device for a semiconductor switch with an improved response behavior. The protection device comprises a dynamic component together with a static component and a capability to analyze switch operations on the semiconductor switch. The dynamic component of the surge protection device activates in the event of a low surge, but is time-limited, however, with respect to the response behavior. Furthermore, the response of the dynamic component of the surge protection device can also be limited such that a response occurs only after switch operations on the semiconductor switch.

13 Claims, 3 Drawing Sheets

(58) Field of Classification Search
USPC .......................................................... 361/93.1
See application file for complete search history.

(56) References Cited

U.S. PATENT DOCUMENTS

| | | |
|---|---|---|
| 6,614,633 B1 | 9/2003 | Kohno |
| 6,853,232 B2 * | 2/2005 | Sander ............... H03K 17/0822 |
| | | 327/312 |
| 2004/0027756 A1 | 2/2004 | Sander et al. |
| 2013/0155560 A1 * | 6/2013 | Takeuchi ................. H02H 3/20 |
| | | 361/89 |

FOREIGN PATENT DOCUMENTS

| EP | 0744834 | 11/1996 |
|---|---|---|
| JP | 2001044291 | 2/2001 |

* cited by examiner

PROTECTION DEVICE FOR A SEMICONDUCTOR SWITCH, AND METHOD FOR OPERATING A PROTECTION DEVICE FOR A SEMICONDUCTOR SWITCH

BACKGROUND OF THE INVENTION

The present invention relates to a protection device for a semiconductor switch for protection against voltage surges as well as to a method for operating a protection device for a semiconductor switch in order to protect against voltage surges.

The use of semiconductor switches as electrical switching elements is known. Hence, voltage surges occur upon opening the switching elements, in particular in power electronic systems, such as, for example, in DC-DC converters or in inverters, on account of the always present leakage inductances. If the current flow through a semiconductor switch is interrupted, the voltage at the semiconductor switch between collector and emitter then increases to a value which can be greater than the supply voltage. If the resulting voltage exceeds the maximum reverse voltage of the semiconductor switch, said semiconductor switch can then be destroyed.

FIG. 1 shows a simple protection circuit for protecting a semiconductor switch T100 against voltage surges. The semiconductor switch T100 is thereby actuated by means of a gate resistor RG of a gate drive circuit 400. An avalanche diode D100 is disposed between the collector C and the gate G of the semiconductor switching element T100. If the voltage between collector C and emitter E at the semiconductor switch T100 exceeds a value predetermined by the avalanche diode D100, said avalanche diode D100 then starts conducting. The semiconductor switch T100 opens thereupon at least partially and therefore becomes slightly conductive. The shutdown speed di/dt of the collector current of T100 is thus reduced to a point such that the collector-emitter voltage is limited to an admissible level.

Due to the static embodiment of this circuit, the shutdown point must lie above the maximum possible supply voltage. Otherwise the danger exists that the semiconductor switch passes over into a continuous operation which would lead to the thermal destruction of said semiconductor switch.

The German patent publication DE 10 2010 008 815 A1 discloses a surge protection for a semiconductor. In this case, the protection circuit for the semiconductor is only then activated if a switch operation is actually performed on the semiconductor switch. After being correspondingly enabled, the protection circuit here too only then begins to respond if the collector-emitter voltage exceeds a threshold value above the maximum supply voltage.

The need therefore exists for an improved surge protection for semiconductor switches. In particular, there is a need for a surge protection for semiconductor switches which responds especially quickly. In addition, there is also a need for a surge protection in which a dangerous continuous operation can be reliably prevented.

SUMMARY OF THE INVENTION

According to one aspect, the present invention provides a protection device for a semiconductor switch comprising a first surge protection, which is designed to actuate the semiconductor switch for a predetermined time period if a voltage at the semiconductor switch exceeds a first threshold value, and a second surge protection which is designed to actuate the semiconductor switch if the voltage at the semiconductor switch exceeds a second threshold value.

According to a further aspect, the present invention provides a method for operating a protection circuit for a semiconductor switch comprising the steps of actuating the semiconductor switch for a predetermined time period if the voltage at the semiconductor switch exceeds a first threshold value; and actuating the semiconductor switch as long as the voltage at the semiconductor switch exceeds a second threshold value.

It is a concept of the present invention, to design the surge protection for a semiconductor switch in two stages. If the voltage at the semiconductor switch exceeds a first threshold value, said semiconductor switch is initially only actuated in a temporally limited manner. By means of this temporal limitation of the actuation, the semiconductor switch is prevented from passing over into a continually conductive state upon exceeding the first voltage threshold. This first threshold value can therefore be selected relatively low. As a result of the first threshold value being set low, it is advantageous that the surge protection already responds at an early stage and therefore ensures a very rapid protection of the semiconductor switch.

In a second stage, the semiconductor switch is then permanently actuated as soon as the voltage at the semiconductor switch exceeds a second threshold value. It is thereby advantageous that the semiconductor switch was already previously actuated in a temporally limited manner by the first surge protection, and thus the control input (gate) of the semiconductor switch is already preconditioned by means of this first actuation. The semiconductor switch can therefore be particularly quickly transferred into a conductive state when the second surge protection is triggered. This causes the surge protection to respond more quickly. The peak values of the transient surge pulses, as they occur during the shutdown processes, thereby turn out to be significantly lower as a result of the quicker response of the surge protection.

In one embodiment, the first threshold value is smaller than the second threshold value. Thus, the semiconductor switch is initially actuated in a temporally limited manner when the first, smaller threshold value has been exceeded, and, as a result, the gate of the semiconductor switch already receives a bias voltage. When the second, larger threshold value has been exceeded, a particularly faster surge protection is then achieved.

According to a further embodiment, the protection device comprises a switch detector which is designed to detect a switch operation at the semiconductor switch. It is therefore possible as a result of detecting a switch operation at the semiconductor switch to react especially quickly to expected voltage surges or to limit the surge protection only to time intervals after a switch operation.

According to a further embodiment, the switch detector is designed to shift the first surge protection into an active state if the semiconductor switch is opened. As a result, the triggering of the surge protection can be limited to a time period after a switch operation at the semiconductor switch.

According to one embodiment, the switch detector is designed to shift the surge protection into an inactive state as long as the semiconductor switch is closed or completely switched off. As a result, the surge protection is prevented from responding to external events. A triggering of the semiconductor switch on account of other events is therefore prevented.

According to a further embodiment, the semiconductor switch is a bipolar transistor with an insulated gate (IGBT) or a MOSFET.

The present invention further comprises an inverter with a semiconductor switch which comprises a protection device according to one embodiment of the present invention.

In one embodiment, the method according to the invention comprises a step for detecting a switch operation at the semiconductor switch, wherein the step for actuating the semiconductor switch is only then carried out for a predetermined time if a switch operation is detected at the semiconductor switch.

BRIEF DESCRIPTION OF THE DRAWINGS

Further features and embodiments ensue from the description in connection with the attached drawings.

In the drawings.

DETAILED DESCRIPTION

Semiconductor switches in accordance with the present invention include all types of switching elements with which an electrical connection can be closed or opened on the basis of a semiconductor structure. The opening and closing of the semiconductor takes place by actuating the semiconductor switch by means of an electrical signal. Semiconductor switches in accordance with the present invention are in particular MOSFETs or IGBTs (Insulated gate bipolar transistors). In addition, the inventive protection device can likewise be used with all other types of semiconductor switches.

Even though the present protection device has been described in connection with semiconductor switches, said device can be used with all other switching elements with which a protection against voltage surges is to be achieved by closing the switching element.

Figure 1:
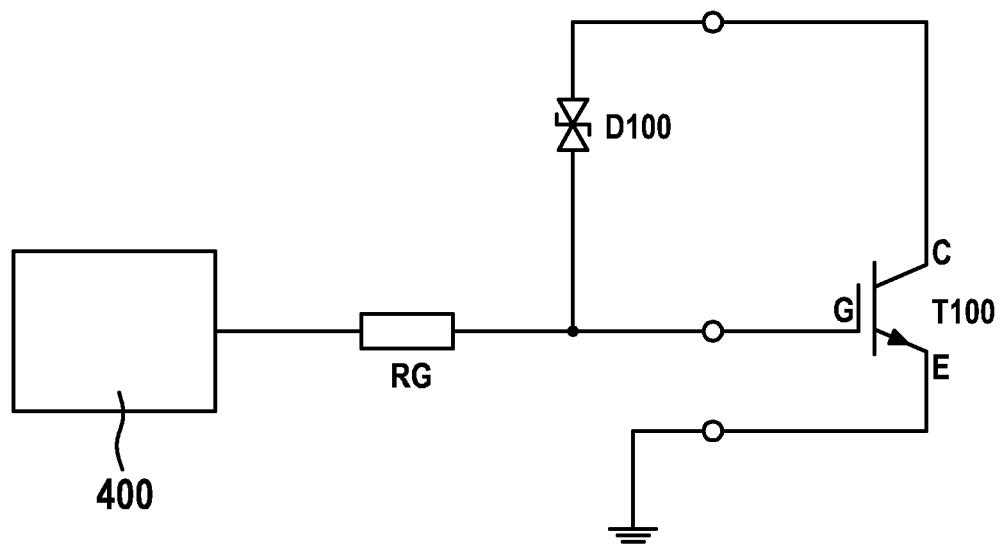
FIG. 1 shows a schematic depiction of a circuit diagram for a protection circuit of a semiconductor switch for protecting against voltage surges.
Figure 2:
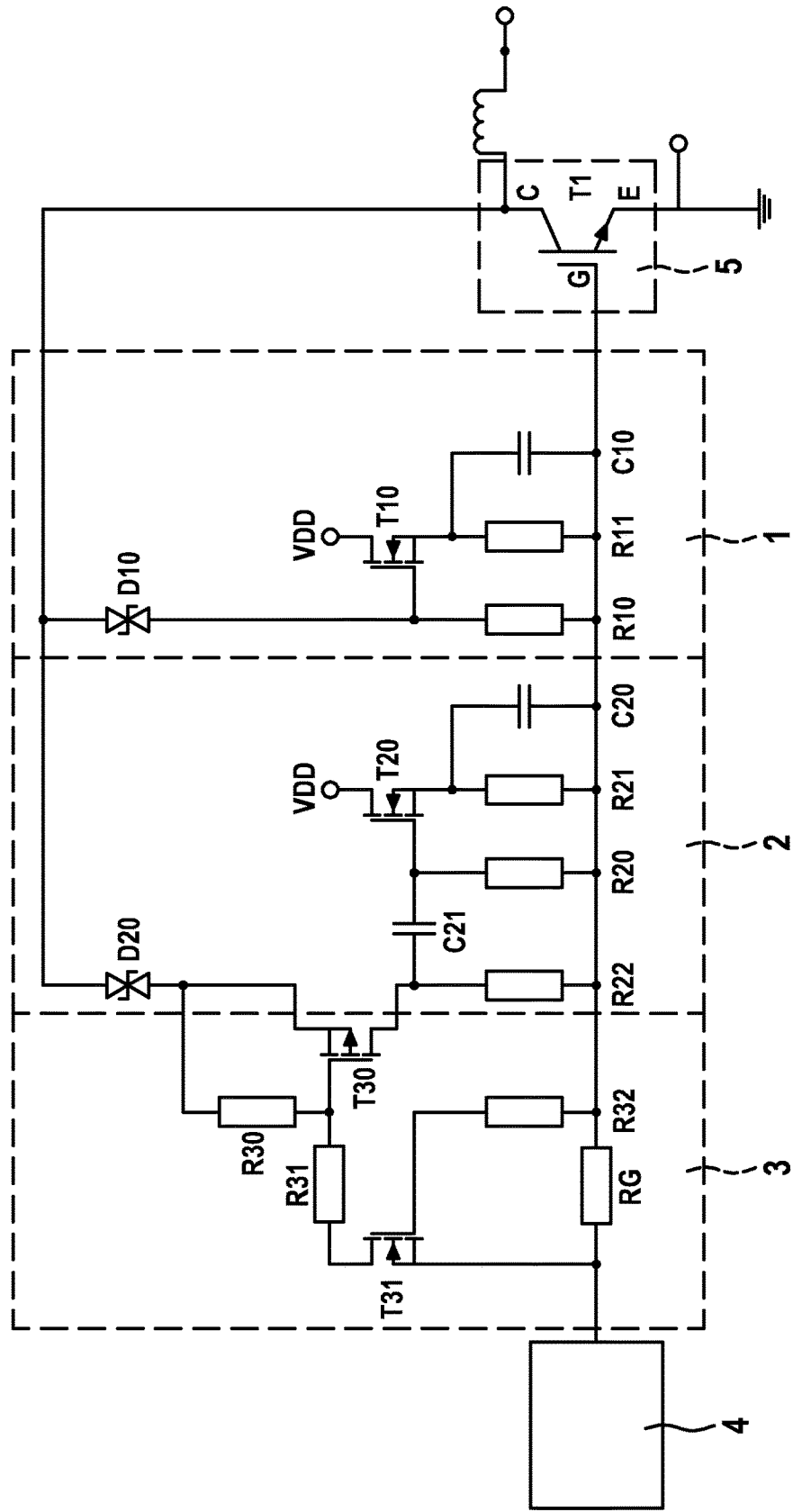
FIG. 2 shows a schematic depiction of a circuit diagram of a protection device for a semiconductor switch according to an embodiment of the present invention.

FIG. 2 shows a schematic depiction of a circuit diagram of a switching device for a semiconductor switch according to one embodiment of the present invention. The semiconductor switch 5 is thereby formed by a transistor T1. By applying a suitable control signal at gate G, an electrically conductive connection can thereby be opened or closed between the collector C and the emitter E. The gate G of the semiconductor switch 5 is actuated by a control signal which a gate driver 4 provides via a gate resistor RG at the gate G of the semiconductor switch 5. In this way, the semiconductor switch 5 can be opened or closed.

In order to protect the semiconductor switch 5 against voltage surges between the emitter E and the collector C, the surge protection comprises a first circuit member 1 which then actuates the gate G of the semiconductor switch 5 if the voltage $U_{CE}$ between the collector C and the emitter E of the semiconductor switch 5 exceeds a predefined threshold value. This threshold value is predefined by means of the semiconductor element D10. The semiconductor element D10 can, for example, relate to a suitable avalanche diode, a Zener diode or another component that reversibly passes over from a blocking into a conductive state above a defined breakdown voltage. The semiconductor element D10 is disposed between the collector C of the semiconductor switch 5 and the control input of a transistor T10.

If the voltage $U_{CE}$ at the semiconductor switch 5 exceeds the threshold value predefined by means of the semiconductor element D10, the transistor D10 is then actuated and passes over into a conductive state. As a result, the gate G of the semiconductor switch 5 is actuated and said semiconductor switch 5 passes thereupon over into an at least slightly conductive state. Due to the subsequently resulting current between the collector C and the emitter E at the semiconductor switch 5, the collector-emitter voltage $U_{CE}$ of said semiconductor switch 5 is also reduced as a result. By a suitable selection of the resistor R11 and the capacitor C10 between the transistor T10 and the gate G of the semiconductor switch 5, said capacitor C10 being connected in parallel with said resistor R11, the actuating behavior can be adjusted in a targeted manner when voltage surges occur.

The protection device also additionally comprises a dynamic surge protection 2. The threshold value for the minimum collector-emitter voltage $U_{CE}$ of the semiconductor switch 5 is thereby determined by means of the semiconductor component D20. The semiconductor component D20 can, analogously to the semiconductor component D10, relate to a Zener diode, an avalanche diode or another component that reversibly passes over from a blocking to a conductive state at a predefined voltage. After the threshold value of the collector-emitter voltage $U_{CE}$ at the semiconductor element 5 has been exceeded, the semiconductor component D20 starts conducting. The transistor T1 is thereupon actuated via the capacitor C21. This further leads to the gate G of the semiconductor switch 5 being actuated when the transistor T20 opens. As a result, the semiconductor switch 5 passes at least slightly over into a conductive state.

A parallel circuit of the resistor R21 and the capacitor C20 is thereby disposed between the transistor T20 and the gate of the semiconductor switch. The actuating signal can be formed by these components when triggering the dynamic surge protection 2.

The time period for the actuation by the dynamic surge protection is limited by the capacitor C21 which is disposed between the voltage limiting semiconductor element D20 and the control signal input of the transistor T20. For that reason, the actuation of the semiconductor switch 5 will again drop away even when the threshold value is exceeded above the threshold predefined by the semiconductor element D20 if the time period predefined by the capacitor C21 is exceeded, even if the collector-emitter voltage $U_{CE}$ at the semiconductor switch 5 still exceeds the threshold value predefined by the semiconductor element D20 at this point in time.

If the collector-emitter voltage $U_{CE}$ at the semiconductor switch 5 continues to increase, a bias voltage is then already applied to the gate G of the semiconductor switch 5 due to the time-limited actuation by means of the dynamic surge protection 2. When a subsequent response of the static surge protection 1 occurs above the voltage predefined by the semiconductor component D10, an actuation of the gate G of the semiconductor switch 5 by means of the static surge protection 1 can therefore lead significantly faster to an opening of the semiconductor switch 5. This particularly fast response of the semiconductor switch 5 leads to the transient surge peaks of the collector-emitter voltage $U_{CE}$ being significantly lower than would be the case without the prior actuation by means of the dynamic surge protection 2.

Because the actuation of the dynamic surge protection 2 by the capacitor C21 can be temporally limited in a targeted manner, there is the danger that the dynamic surge protection 2 leads to a permanent actuation of the semiconductor switch 5. A threshold voltage can therefore be selected for the semiconductor component D20 which lies below the maximum operating voltage of the semiconductor switch 5. This allows for a response of the surge protection to occur at a particularly early stage.

The protection device according to the invention can also additionally comprise a circuit member 3 which further limits the response of the dynamic surge protection 2. It is thus, for example, possible that the surge protection 2 only then responds if a detected surge stems from a switch operation by the gate driver 4. Particularly if the threshold value for the response of the dynamic surge protection lies below the maximum operating voltage, a response of the dynamic surge protection can therefore be prevented at times outside of the switch operations if the voltage at the semiconductor switch is close to the maximum operating voltage and therefore the semiconductor component D20 would otherwise trigger a response of the surge protection.

For this purpose, a switch detector is formed by the circuit section 3, said detector analyzing a voltage drop across the gate resistor RG between the gate driver 4 and the gate G of the semiconductor switch 5. In this way, the dynamic surge protection 2 is only then activated by means of the transistors T30 and T31 if a shutdown procedure of the semiconductor switch 5 is actually the cause for a voltage surge between the collector C and the emitter E at the semiconductor switch 5. Otherwise the circuit remains inactive. The opening of the semiconductor switch 5 is therefore limited to the points in time after a switch operation of the gate driver 4.

The inventive protection device for protecting a semiconductor switch against voltage surges can thus be used everywhere, where semiconductor switches are to be protected against transient voltage surges after switching processes. In particular, the surge protection device according to the invention can, for example, be used with DC-DC converters comprising semiconductor switches or also with inverters comprising semiconductor switches. In addition, a surge protection device according to the invention can, for example, be used with inverters for actuating electrical drives. This is due to the fact that parasitic inductances during switch operations can lead to high voltage surges in such superstructures.

Figure 3:
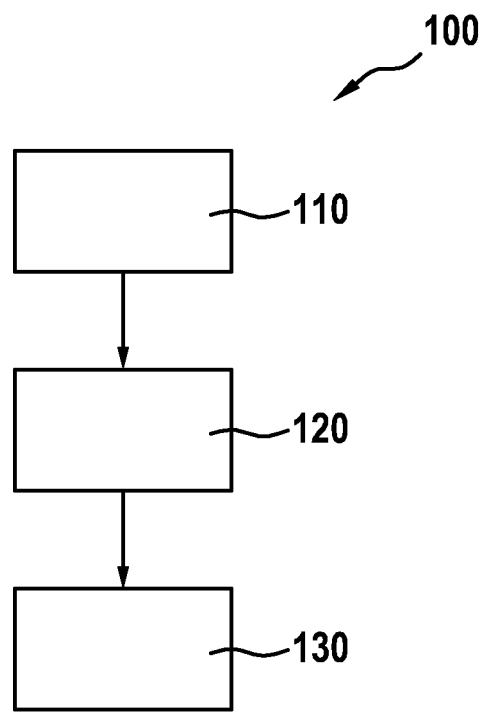
FIG. 3 shows a schematic depiction of a method for operating a protection circuit for a semiconductor switch according to a further embodiment of the present invention.

FIG. 3 shows a schematic depiction of a method 100 for operating a protection circuit for a semiconductor switch. A switch operation at the semiconductor switch 5 is detected in step 110. This can, for example, be a change in the signal from a gate driver 4 which is detected by the switch detector 3. Said switch detector 3 subsequently enables a first surge protection 2. In a further step 120, the semiconductor switch 5 is thereupon actuated for a predetermined time period if a voltage $U_{CE}$ at the semiconductor switch 5 exceeds a first threshold value. After this predetermined time period, the semiconductor switch 5 itself is not actuated if the voltage $U_{CE}$ exceeds the first threshold value.

In a further step 130, the semiconductor switch 5 is furthermore actuated as long as the voltage $U_{CE}$ at the semiconductor switch 5 exceeds a second threshold value. This actuation of the semiconductor switch 5 above the second threshold value takes place without temporal limitation. A voltage is therefore to be selected for the second threshold value which lies above the maximum operating voltage in order to prevent a permanent actuation of the semiconductor switch 5 and consequently a thermal destruction of said semiconductor switch 5.

In summary, the present invention relates to a protection device for a semiconductor switch, said device having an improved response behavior. The protection device comprises a dynamic component together with a static component and a capability to analyze switch operations at the semiconductor switch. The dynamic component of the surge protection activates in the event of a low surge but is time-limited, however, with respect to the response behavior. Furthermore, the response of the dynamic component of the surge protection device can also be limited such that a response occurs only after switch operations at the semiconductor switch.

The invention claimed is:

1. A protection device for protecting a semiconductor switch against a voltage surge, the protection device comprising:
    a driver configured to provide control signals to the semiconductor switch;
    a first surge protection circuit configured to actuate the semiconductor switch for a predetermined time period if a voltage at the semiconductor switch exceeds a first threshold value, wherein the first surge protection circuit includes a first semiconductor element that reversibly passes over from a blocking state into a conductive state; and
    a second surge protection circuit configured to actuate the semiconductor switch if the voltage at the semiconductor switch exceeds a second threshold value, wherein the second surge protection circuit includes a second semiconductor element that reversibly passes over from a blocking state into a conductive state,
    wherein the first surge protection circuit includes a first transistor configured to open when the first semiconductor element starts conducting, and wherein the second surge protection circuit includes a second transistor configured to open when the second semiconductor element starts conducting.

2. The protection device according to claim 1, wherein the first threshold value is smaller than the second threshold value.

3. The protection device according to claim 1, further comprising a switch detector configured to detect a switch operation at the semiconductor switch by analyzing a voltage drop across a gate resistor positioned between the driver and the semiconductor switch.

4. The protection device according to claim 3, wherein the switch detector is configured to transfer the first surge protection circuit into an active state when the detected switch operation indicates the semiconductor switch is open.

5. The protection device according to claim 3, wherein the switch detector is configured to transfer the first surge protection circuit into an inactive state as long as the detected switch operation indicates the semiconductor switch is closed.

6. The protection device according to claim 1, wherein the semiconductor switch is a bipolar transistor with an insulated gate or a MOSFET.

7. An inverter comprising a semiconductor switch which has the protection device according to claim 1.

8. The protection device of claim 1, wherein the first threshold value is predefined by the first semiconductor element and the second threshold value is predefined by the second semiconductor element different than the first semiconductor element.

9. The protection device of claim 1, wherein the first surge protection circuit is configured to actuate the semiconductor switch when the first transistor opens and wherein the second surge protection circuit is configured to actuate the semiconductor switch when the second transistor opens.

10. The protection device of claim 1, wherein the predetermined time period is predefined by a capacitor associated with the first surge protection circuit.

11. The protection device of claim 1, wherein the first threshold value is less than a maximum operating voltage of the semiconductor switch and the second threshold value is greater than the maximum operating voltage of the semiconductor switch.

12. A method for operating a protection circuit for protecting a semiconductor switch against a voltage surge, comprising the following steps:

detecting, with a switch detector, a switch operation at the semiconductor switch;

actuating, with a first surge protection circuit, the semiconductor switch for a predetermined time period if the voltage at the semiconductor switch exceeds a first threshold value, the first surge protection circuit including a first semiconductor element that reversibly passes over from a blocking state into a conductive state; and actuating, with a second surge protection circuit, the semiconductor switch as long as the voltage at the semiconductor switch exceeds a second threshold value, the second surge protection circuit including a second semiconductor element that reversibly passes over from a blocking state into a conductive state, wherein the first surge protection circuit includes a first transistor configured to open when the first semiconductor element starts conducting, and wherein the second surge protection circuit includes a second transistor configured to open when the second semiconductor element starts conducting.

13. The method according to claim 12, wherein detecting the switch operation at the semiconductor switch includes detecting a switch operation by analyzing a voltage drop across a gate resistor positioned between a driver and the semiconductor switch, wherein the step for actuating the semiconductor switch for the predetermined time is only carried out when the detected switch operation indicates the semiconductor switch is open.

* * * * *